United States Patent [19]

Pace

[11] 4,340,868
[45] Jul. 20, 1982

[54] CURRENT MODE BIQUADRATIC ACTIVE FILTER

[75] Inventor: Gary L. Pace, Ft. Lauderdale, Fla.

[73] Assignee: Motorola, Inc., Schaumburg, Ill.

[21] Appl. No.: 148,850

[22] Filed: May 12, 1980

[51] Int. Cl.³ .............................................. H03F 1/34
[52] U.S. Cl. .................................... 330/294; 330/109; 330/303
[58] Field of Search ............... 330/294, 303, 305, 306, 330/107, 109, 98

[56] References Cited

U.S. PATENT DOCUMENTS 3,792,367  2/1974  Fleischer et al. ...................... 330/98

Primary Examiner—James B. Mullins
Assistant Examiner—Gene Wan
Attorney, Agent, or Firm—Margaret M. Parker; James S. Pristelski; James W. Gillman

[57] ABSTRACT

A configuration of two transistors and two capacitors provides a current mode second-order active filter for IC implementation with low-pass, bandpass and high-pass capabilities. The filter frequency is tunable over a wide range, independently of filter Q and gain, by varying a DC bias current. The filter can provide one-port impedance functions, and two-port voltage, current and impedance transfer functions. With the addition of a second biasing current source, the filter Q can be controlled by adjusting the ratio of the two biasing current sources. Enhanced dynamic range and large-signal performance can be achieved by the addition of linear resistors, with trade-offs in tunable frequency range and frequency linearity.

18 Claims, 9 Drawing Figures

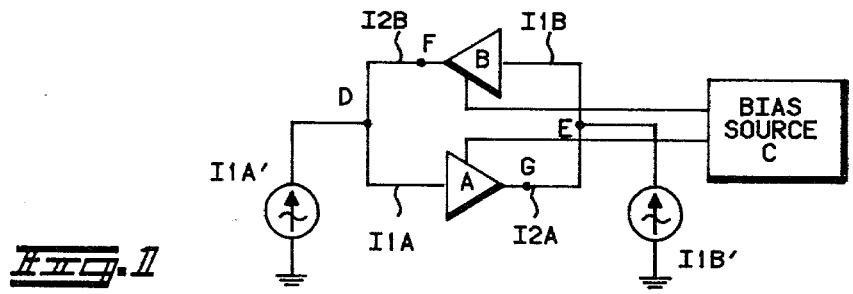
Fig. 1
| OUTPUT<br>INPUT | I2A | I2B |
|---|---|---|
| I1A' | BANDPASS | LOW-PASS |
| I1B' | LOW-PASS | BANDPASS |
Fig. 2
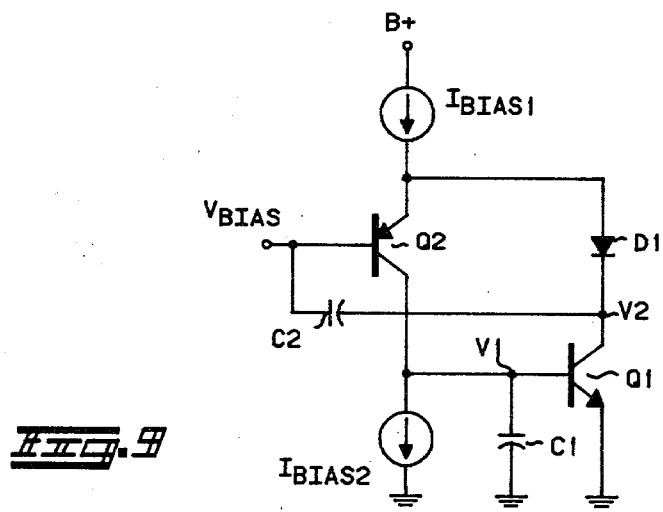
Fig. 3

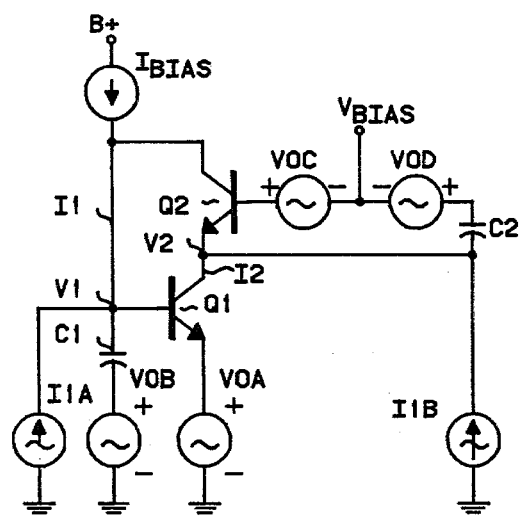
Fig. 3
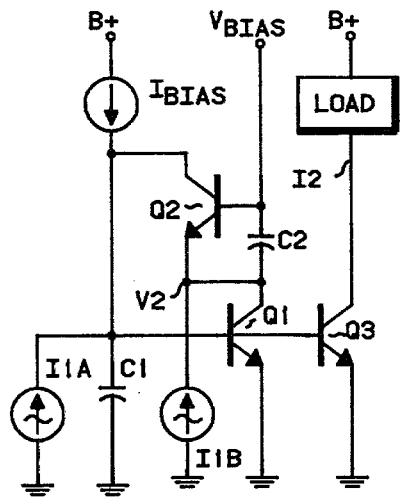
Fig. 4
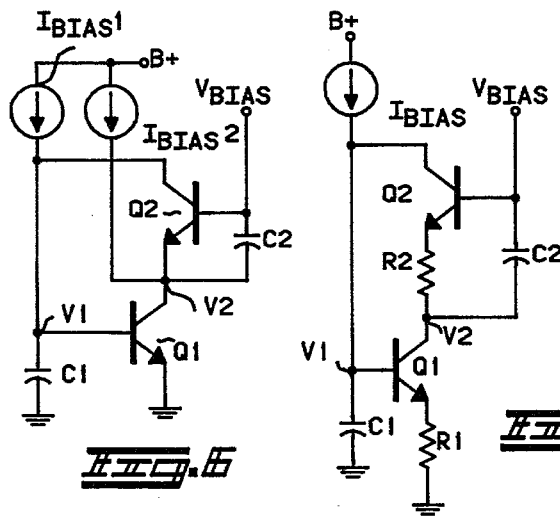
Fig. 6   Fig. 7   Fig. 8
Fig. 5
| INPUT \ OUTPUT | I1 | I2 | V1 | V2 |
|---|---|---|---|---|
| I1A | LOW-PASS | BANDPASS | BANDPASS | LOW-PASS |
| I1B | BANDPASS | LOW-PASS | LOW-PASS | BANDPASS |
| VOA | BANDPASS | HIGH-PASS | LOW-PASS | BANDPASS |
| VOB | BANDPASS | HIGH-PASS | HIGH-PASS | BANDPASS |
| VOC | HIGH-PASS | BANDPASS | BANDPASS | LOW-PASS |
| VOD | HIGH-PASS | BANDPASS | BANDPASS | HIGH-PASS |

CURRENT MODE BIQUADRATIC ACTIVE FILTER

BACKGROUND OF THE INVENTION

This invention relates to the field of active filters and, more particularly, to filter design using current mode operation, a minimum of components and supply voltage, and which is particularly suited to IC implementation.

In the past, most biquadratic active RC filter designs have used voltage mode operation with a relatively large number of components. The use of these filters in integrated circuit form has been limited by filter frequency variations due to the large tolerances on IC resistor and capacitor values, and by Q-enhancement or oscillation at high frequencies. These tolerances necessitate filter tuning if filter frequency is critical. The performance of many existing filter circuits would be degraded in an IC implementation due to the need for ungrounded capacitors. As is known in IC design, any capacitor not connected to either real or AC ground will be accompanied by a parasitic capacitor. Some previous designs have also required differential inputs which usually require additional components.

SUMMARY OF THE INVENTION

It is, therefore, an object of the present invention to provide a current-mode, second order low-pass, bandpass or high-pass active filter requiring a minimum number of components.

It is a particular object to provide such a filter by simple integrated circuit implementation, with either fixed or variable tuning, and for operation with a low voltage supply.

It is a specific object to provide a filter which will realize one-port impedance functions with two-port voltage, current or impedance transfer functions.

These objects and others are obtained in a filter circuit requiring, as a basis, two transistors of similar type, coupled in series fashion between a source of bias current and ground. The dynamic resistances of the base-emitter junctions are used as resistive elements of the filter. A capacitor is coupled across the base-emitter junction of one transistor and another capacitor across the base-emitter junction of the second transistor. The choice of input and output points determines the mode of operation as well as the filter characteristic.

BRIEF DESCRIPTION OF THE DRAWINGS

FIG. 1 is a block diagram of the basic circuit of the invention.

FIG. 2 is an I/O chart for FIG. 1.

FIG. 3 is a schematic diagram of a basic circuit design of the filter of the invention.

FIG. 4 is a schematic diagram of a variation of the circuit of FIG. 3.

FIG. 5 is a chart of types of inputs and outputs as related to the circuits of FIGS. 3 and 4.

FIG. 6 is a schematic diagram of a second variation of the circuit of FIG. 3.

FIG. 7 is a schematic diagram of a third variation of the circuit of FIG. 3.

FIG. 8 is a schematic diagram of an alternate design for the filter of the invention.

FIG. 9 is a schematic diagram of a variation of the circuit of FIG. 8.

DETAILED DESCRIPTION OF THE PREFERRED EMBODIMENT

The block diagram of FIG. 1 is a tunable current mode active filter which can realize second order low-pass and bandpass current transfer functions. The amplifiers in FIG. 1 are current gain amplifiers, each with a first order low-pass characteristic as follows:

$$\text{Amplifier } A: \frac{I2A}{I1A} = \frac{K_A \omega_A}{S + \omega_A}$$

$$\text{Amplifier } B: \frac{I2B}{I1B} = \frac{-K_B \omega_B}{S + \omega_B}$$

where $K_A$ and $K_B$ are the DC current gains and $\omega_A$ and $\omega_B$ are the 3 db corner frequencies for the two amplifiers. Frequencies $\omega_A$ and $\omega_B$ are simultaneously controlled by a bias source C connected to both amplifiers. The amplifiers are connected in a negative current feedback configuration as shown in FIG. 1. To ensure negative current feedback, one amplifier must be non-inverting and the other inverting. An input current can be applied to either point D or point E. Output currents are simultaneously available at points F and G. To utilize the output current(s) a floating (ungrounded) load would be inserted in the line at the output of either or both amplifiers. The low-pass and bandpass current transfer functions available are tabulated in FIG. 2. In particular, the low-pass and bandpass current transfer functions available from points F and G with a small-signal current source input at point D are given by:

Low-Pass:
$$\frac{I2B}{I1A'} = \frac{K_A K_B \omega_A \omega_B}{S^2 + (\omega_A + \omega_B)S + \omega_A \omega_B (K_A K_B + 1)}$$

Bandpass:
$$\frac{I2A}{I1A'} = \frac{K_A \omega_A (S + \omega_B)}{S^2 + (\omega_A + \omega_B)S + \omega_A \omega_B (K_A K_B + 1)}$$

Filter frequency $\omega_n$ and $Q$ are given by:

$$\omega_n = \sqrt{\omega_A \omega_B (K_A K_B + 1)}$$

$$Q = \frac{\sqrt{\omega_A \omega_B (K_A K_B + 1)}}{\omega_A + \omega_B}$$

Filter frequency $\omega_n$ can be controlled by using bias source C.

In FIG. 3, the basic circuit of the filter design is given, with Q1 and Q2 both NPN transistors, and coupled in series between a source of bias current and ground with the collector of Q2 connected to the base of Q1. Across the base-emitter junction of Q1 is C1 and across the base-emitter junction of Q2 is C2, with a bias voltage coupled to the base of Q2. FIG. 3 could equally well show the capacitors C1, C2 coupled from the collectors of Q2, Q1, respectively, to actual ground since $V_{BIAS}$ is at AC ground potential. Referring to the chart of FIG. 5, it will be seen that if an input current I1A is coupled into the node designated V1, current output I1 may be taken from the collector of Q2, giving a low-pass characteristic. At the same time, from the collector of Q1, an output current I2 with a bandpass characteristic can be obtained, a voltage output is available at V1 with a bandpass characteristic, and a voltage output is available at V2 with a low-pass characteristic. If, instead, current source I1B is coupled into the node V2, the previously given characteristics will be reversed; i.e., I1 will have a bandpass characteristic, I2 will have a low-pass characteristic, at V2, a bandpass characteristic will be obtained, at V1, a low-pass characteristic. If, on the other hand, the available input is a voltage, it may be inserted at four different points and, again, a variety of output characteristics may be obtained, including a high-pass characteristic. If, for example, a voltage signal source VOA is coupled between the emitter of Q1 and ground, at node V1 a low-pass characteristic will be obtained and at V2 a bandpass characteristic, whereas if the input signal is applied at VOB, a high-pass characteristic will be obtained at V1 and a bandpass characteristic at V2. It is to be understood that while two current inputs and four voltage inputs are indicated, only one input would normally be utilized at any one time; i.e., any unused voltage source would be replaced by a short circuit, and any unused current source by an open circuit. The drawing is so drawn to avoid a multiplicity of drawing figures.

The filtering operation of the circuit is the result of the current feedback loop consisting of transistors Q1 and Q2 and the controlled phase shift around the loop. Phase shift is controlled by the two capacitors C1 and C2, and by the dynamic resistances $r_e1$ and $r_e2$ of the forward biased base-emitter junctions of the two transistors Q1 and Q2. For proper operation, the filter circuit requires two DC bias supplies, V bias and I bias. V bias is a DC voltage source which is selected to be approximately 1.5 times the average base-emitter voltage drop of transistors Q1 and Q2. The V bias supply limits the minimum DC operating voltage of the filter to approximately 0.8 volts. I bias is a DC current source which is needed to control the DC emitter currents of Q1 and Q2. For sufficiently large transistor $\beta$, the low-pass, bandpass and high-pass voltage transfer functions are given by:

Low-Pass
$$\frac{V1}{V0A} = \frac{\frac{1}{r_e1 r_e2 C1 C2}}{S^2 + \frac{S}{r_e2 C2} + \frac{1}{r_e1 r_e2 C1 C2}} \quad (1)$$

Bandpass
$$\frac{V2}{V0A} = \frac{\frac{S}{r_e1 C2}}{S^2 + \frac{S}{r_e2 C2} + \frac{1}{r_e1 r_e2 C1 C2}} \quad (2)$$

High-Pass
$$\frac{V2}{V0D} = \frac{S^2}{S^2 + \frac{S}{r_e2 C2} + \frac{1}{r_e1 r_e2 C1 C2}} \quad (3)$$

From these expressions, filter frequency $\omega_n$ and Q can be derived:

$$\omega_n = \frac{1}{\sqrt{r_e1 r_e2 C1 C2}} \quad (4)$$

$$Q = \sqrt{\frac{r_e2 C2}{r_e1 C1}} \quad (5)$$

where $r_e1$ is an inverse function of $I_e1$, the DC emitter current in Q1, and $r_e2$ is an inverse function of $I_e2$, the DC emitter current in Q2. For large transistor $\beta$, ($\beta >> 1$):

$$I_e1 = I_e2 = I_{BIAS} \quad (6)$$

In this case, equation (5) reduces to $$Q = \sqrt{C2/C1} \quad (7)$$

showing that filter Q is determined by the ratio C2/C1. From the above equations, it will be seen that filter frequency $\omega_n$ is directly proportional to the DC bias current $I_{BIAS}$. Therefore, the filter frequency is tunable, independently of filter Q, by varying the DC bias current. The frequency of several cascaded active filter sections can be controlled simultaneously by applying the same bias current to each section. This is easily accomplished by using the tracking current sources available on integrated circuits.

In FIG. 4 a third transistor, Q3, has been added to permit the utilization of output current I2 in a nonfloating load. All filter responses in column I2 of FIG. 5 are available except for that requiring input voltage VOA.

In FIG. 6, it will be seen that a second biasing current source $I_{BIAS}2$ has been added at node V2 to allow separate control of the DC emitter currents of transistors Q1 and Q2. From equation (5), given above, it will be seen that filter Q can also be controlled by adjusting the ratio of the two biasing current sources. A given filter Q can, therefore, be realized by using less circuit capacitance (C1+C2) than is possible for the basic filter circuit of FIG. 3. This is especially important in integrated circuit applications. The filter frequency is tunable over a wide frequency range, independent of Q, by using two tracking current sources to control the two bias currents.

In FIG. 7, another modification of the basic circuit is given, wherein two resistive elements R1 and R2 have been added in series with the emitters of Q1 and Q2 in order to improve dynamic range. The large-signal performance and dynamic range of the basic circuit are limited by the non-linear voltage-current characteristic of the transistor forward-biased base-emitter junction. Therefore, an improvement in these characteristics can be achieved if a portion of the non-linear resistance is replaced by a discrete linear resistance. One disadvantage of this modification is that the frequency range over which the filter can be tuned by adjusting the bias current is now reduced, and the filter frequency becomes a non-linear function of the bias current. Obviously, however, if the advantages of this circuit outweigh the disadvantages for a particular application, including the need for two discrete resistive elements, this circuit would be chosen.

In FIG. 8, another version of the filter circuit is given which is not merely a modification of that shown in FIG. 1. It will be seen that the transistors Q1 and Q2 are no longer of the same type, and that an additional biasing current source ($I_{BIAS}1$) has been added at node V2. An advantage of this alternate circuit is that the range of $V_{BIAS}$ is now limited only by the B+ supply voltage. In the circuit of FIG. 3, $V_{BIAS}$ was constrained to a narrow range of voltage values; i.e., between one and two base-emitter voltage drops.

In FIG. 9, a p-n junction diode D1 has been added to the circuit shown in FIG. 8 to improve the dynamic range. An added advantage provided by this modification is that, where $I_{BIAS}1 = 2I_{BIAS}2$, the DC offset voltage between the base of Q2 and node V2 is zero. This condition allows low-pass filter sections using input voltage source VOC and output node V2 to be cascaded, and to operate at power supply voltages lower than one volt.

It will be understood by those skilled in the art that, of the various modifications given hereinabove, many combinations thereof may be made; e.g., the circuit modification of FIGS. 4 and 7 are applicable to the alternate circuit of FIG. 8. It is, of course, understood that the actual transistor types given herein are exemplary only and are not to be construed as limiting.

Thus, there has been shown and described an improved active filter for implementation on an integrated circuit chip, in which the dynamic resistance of the base-emitter junctions of two transistors are utilized in conjunction with two relatively small capacitors to provide a multiplicity of operational modes and filter characteristics. Since the capacitors are connected either to real ground, AC ground, or a zero impedance small-signal voltage source, parasitic capacitors are either eliminated or their effect made negligible and implementation in integrated circuit form becomes possible without performance degradation. It will be apparent that other modifications and variations of the examples given hereinabove are possible within the spirit and scope of the appended claims.

What is claimed is:

1. A tunable current mode active filter comprising:
   first and second current gain amplifier means coupled together for negative current feedback and including first and second transistors respectively;
   a bias voltage source coupled to control the operating voltage of the filter;
   a bias current source coupled to control the DC emitter currents of at least one of the transistors;
   a first capacitor coupled between the collector of the first transistor and ground;
   a second capacitor coupled between the collector of the second transistor and ground;
   input means coupled to the amplifier means for receiving an input current;
   first output means coupled to the amplifier means for providing a first output current having a first filter characteristic; and
   second output means coupled to the amplifier means for providing a second output current having a second filter characteristic.

2. A tunable current mode active filter in accordance with claim 1 wherein the first and second transistors are both of the same conductivity type and the collector of the first transistor is coupled to the base of the second transistor and the collector of the second transistor is coupled to the emitter of the first transistor.

3. A tunable current mode active filter in accordance with claim 1 and wherein the collector of one of the transistors is coupled to the input means and the first output means, and the collector of the other of the transistors is coupled to the second output means.

4. A tunable current mode active filter in accordance with claim 1 and wherein the first filter characteristic is a predetermined one of the filter characteristics, low-pass or bandpass and the second filter characteristic is a different one of said characteristics.

5. A tunable current mode active filter in accordance with claim 2 wherein the collector of the first transistor is coupled to the input means and further including third output means coupled to the amplifier means for providing an output voltage.

6. A tunable current mode active filter in accordance with claim 5 and wherein the third output means is coupled between the collector of the first transistor and ground for providing an output voltage having a bandpass characteristic.

7. A tunable current mode active filter in accordance with claim 5 wherein the third output means is coupled between the collector of the second transistor and ground for providing an output voltage having a low-pass characteristic.

8. A tunable current mode active filter in accordance with claim 2 and further including a second input coupled in series with one of the capacitors for receiving an input voltage, and wherein a high-pass characteristic is available at one of the current output means and a bandpass characteristic at the other of the current output means.

9. A tunable current mode active filter in accordance with claim 2 and further including third and fourth output means coupled to the first and second amplifier means, and wherein a high-pass characteristic is available at one of the third and fourth output means and a bandpass characteristic at the other of the third and fourth output means.

10. A tunable current mode active filter in accordance with claim 2 and further including third transistor means coupled to the second transistor means, and third output means coupled to the third transistor means.

11. A tunable current mode active filter in accordance with claim 2 wherein said bias current source is coupled to control the emitter current of one of the transistors, and further including a second bias current source coupled to control the emitter current of the other transistor.

12. A tunable current mode active filter in accordance with claim 2 and further including first and second resistive elements coupled in series with the respective emitters of the first and second transistors.

13. A tunable current mode active filter in accordance with claim 1 wherein the first and second transistors are of opposite conductivity types and the collector of the first transistor is coupled to the base of the second transistor and the collector of the second transistor is coupled to the emitter of the first transistor, and further including a second bias current source.

14. A tunable current mode active filter in accordance with claim 13 further including diode means coupled between the collector of the second transistor and the emitter of the first transistor.

15. A tunable current mode active filter in accordance with claim 14 and wherein the current supplied by one of the the bias current sources is greater than the current supplied by the other bias current source.

16. A tunable current mode active filter in accordance with claim 2 and further including a second input coupled in series with the emitter of the second transistor for receiving an input voltage.

17. A tunable current mode active filter in accordance with claim 16 and wherein the first output means provides an output current having a high-pass characteristic and the second output means provides an output current having a bandpass characteristic.

18. A tunable current mode active filter in accordance with claim 16 and further including third and fourth output means for providing output voltages having low-pass and bandpass characteristics, respectively.

* * * * *